(12) United States Patent
Hiraki

(10) Patent No.: US 8,205,328 B2
(45) Date of Patent: Jun. 26, 2012

(54) COMPONENTS PACKAGING METHOD

(75) Inventor: Tsutomu Hiraki, Yamanashi (JP)

(73) Assignee: Panasonic Corporation, Osaka (JP)

( * ) Notice: Subject to any disclaimer, the term of this patent is extended or adjusted under 35 U.S.C. 154(b) by 18 days.

(21) Appl. No.: 12/791,376

(22) Filed: Jun. 1, 2010

(65) Prior Publication Data

US 2010/0299916 A1    Dec. 2, 2010

(30) Foreign Application Priority Data

Jun. 2, 2009  (JP) .................................. 2009-132807

(51) Int. Cl.
*H05K 3/30* (2006.01)
(52) U.S. Cl. ................. 29/832; 29/825; 29/840
(58) Field of Classification Search ............ 29/825, 29/832, 840, 846
See application file for complete search history.

(56) References Cited

FOREIGN PATENT DOCUMENTS

| JP | 2001-015533 A | 1/2001 |
| JP | 2009-135365 A | 6/2009 |
| WO | 2008/032755 A1 * | 3/2008 |

* cited by examiner

*Primary Examiner* — Carl Arbes
(74) *Attorney, Agent, or Firm* — Pearne & Gordon LLP

(57) ABSTRACT

A tools holding member 63 which holds replacement tools 23*a*, 34*a*, 44*a* for a pick-up head 22, a mounting head 33 and a stamping head 44 which are provided so as to move freely in a Y-axis direction in which a components supply stage 3 and a substrate holding stage 4 are aligned is provided on an overlapping area R of a moving area R1 over which the pick-up head 22 can move, a moving area R2 over which the mounting head 33 can move and a moving area R3 over which the stamping head 43 can move which lies on a moving table 15 which is provided in an area R0 lying between the components supply stage 3 and the substrate holding stage 4 so as to move freely in an X-axis direction which is at right angles to a Y-axis.

2 Claims, 9 Drawing Sheets

COMPONENTS PACKAGING METHOD

BACKGROUND

1. Field of the Invention

The present invention relates to a components packaging system in which components supplied from a component supply portion are picked up so as to be mounted on a substrate held at a substrate holding portion.

2. Description of the Related Art

In some components packaging systems, after a paste is stamped on to a substrate held on a substrate holding portion by a stamping head, a component supplied from a components supply portion is picked up by a mounting head, and the component so picked up is then mounted on the substrate on to which the paste has been stamped. Among these components packaging systems, there is known a components packaging system in which in place of a mounting head picking up a component from a components supply portion so as to mount the component so picked up directly on a substrate, a component supplied from the components supply portion is picked up by a pick-up head which is provided separately from the mounting head, and the mounting head receives the component picked up by the pick-up head directly from the pick-up head or indirectly via a intermediate stage which is disposed between the components supply portion and a substrate holding portion so as to mount the component so received on a substrate held on the substrate holding portion (Patent Document 1).

Patent Document 1: JP-A-2001-15533

In the components packaging system in which the mounting head receives the component from the pick-up head to mount the component on the substrate, not only a tool with which the mounting head picks up a component but also a tool with which the pick-up head picks up a component is necessary. Further, a stamping tool like a stamp (a pin) is necessary to stamp a paste such as a solder paste on to a substrate. In addition, since these tools need to be replaced in accordance with shapes of components, a tools holding member for holding such replacement tools in advance needs to be provided in an area which can be accessed by the three heads such as the pick-up head, the mounting head and the stamping head. To make this happen, the tools holding member is desirably disposed in an area lying between the components supply portion and the substrate holding portion.

In recent components packaging systems in which various components and mechanisms are disposed closely on a base from the viewpoint of realizing a compact component packaging system, there has been a problem that it is difficult to install the tools holding member in the area lying between the tools supply portion and the substrate holding portion.

SUMMARY

Then, the invention has been made with a view to solving the problem, and an object thereof is to provide a components packaging system which can be made compact as a whole even though a tools holding member which can be accessed by three heads such as a pick-up head, a mounting head and a stamping head is installed between a components supply portion and a substrate holding portion.

According to a first aspect of the invention, there is provided a components packaging system comprising a component supply portion for supplying components, a substrate holding portion for holding a substrate, a stamping head provided movably in a first direction which is horizontal and in which the components supply portion and the substrate holding portion are aligned for stamping a paste on to a substrate held on the substrate holding portion by use of a stamping tool, a pick-up head provided movably in the first direction for picking up a component supplied by the components supply portion by a pick-up tool, a mounting head provided movably in the first direction for receiving the component picked up by the pick-up head by a mounting tool so as to mount the component on the substrate on to which the paste has been stamped by the stamping head, and tools holding member for holding replacement tools for the pick-up tool, the mounting tool and the stamping tool, wherein a movable table movable in a second direction which is horizontal and which is at right angles to the first direction is provided in an area lying between the components supply portion and the substrate holding portion, and wherein the tools holding member is provided in an area on the movable table where a moving area over which the pick-up head can move, a moving area over which the mounting head can move and a moving area over which the stamping head can move overlap.

According to a second aspect of the invention, there is provided a components packaging system as set forth in the first aspect, wherein an order in which the pick-up head, the mounting head and the stamping head are aligned and an order in which the a replacement pick-up tool, a replacement mounting tool and a replacement stamping tool are aligned on the tools holding member are the same.

In the invention, the movable table is provided in the area lying between the components supply portion and the substrate holding portion which can move freely in the horizontal direction (the second direction) which is at right angles to the horizontal direction (the first direction) in which the components supply portion and the substrate holding portion are aligned, and the tools holding member is provided in the area on the movable table where the moving area where the pick-up head can move, the moving area where the mounting head can move and the moving area where the stamping head can move overlap. Therefore, the components packaging system can be made compact as a whole even though the tools holding member that can be accessed by the three heads such as the pick-up head, the mounting head and the stamping head 3 is installed between the components supply portion and the substrate holding portion.

DETAILED DESCRIPTION

Figure 1:
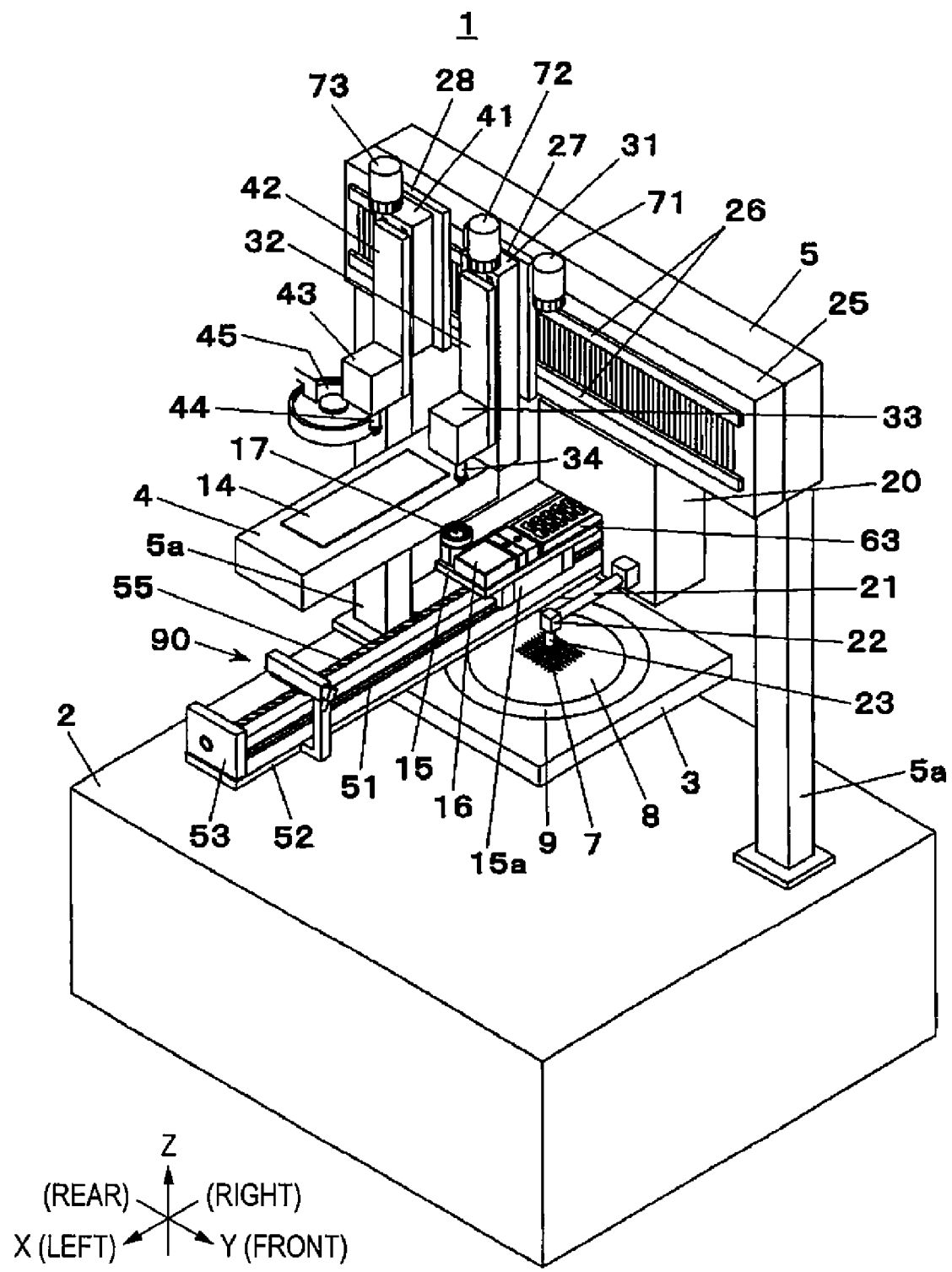
FIG. 1 is a perspective view of a components packaging system according to an embodiment of the invention.
Figure 2:
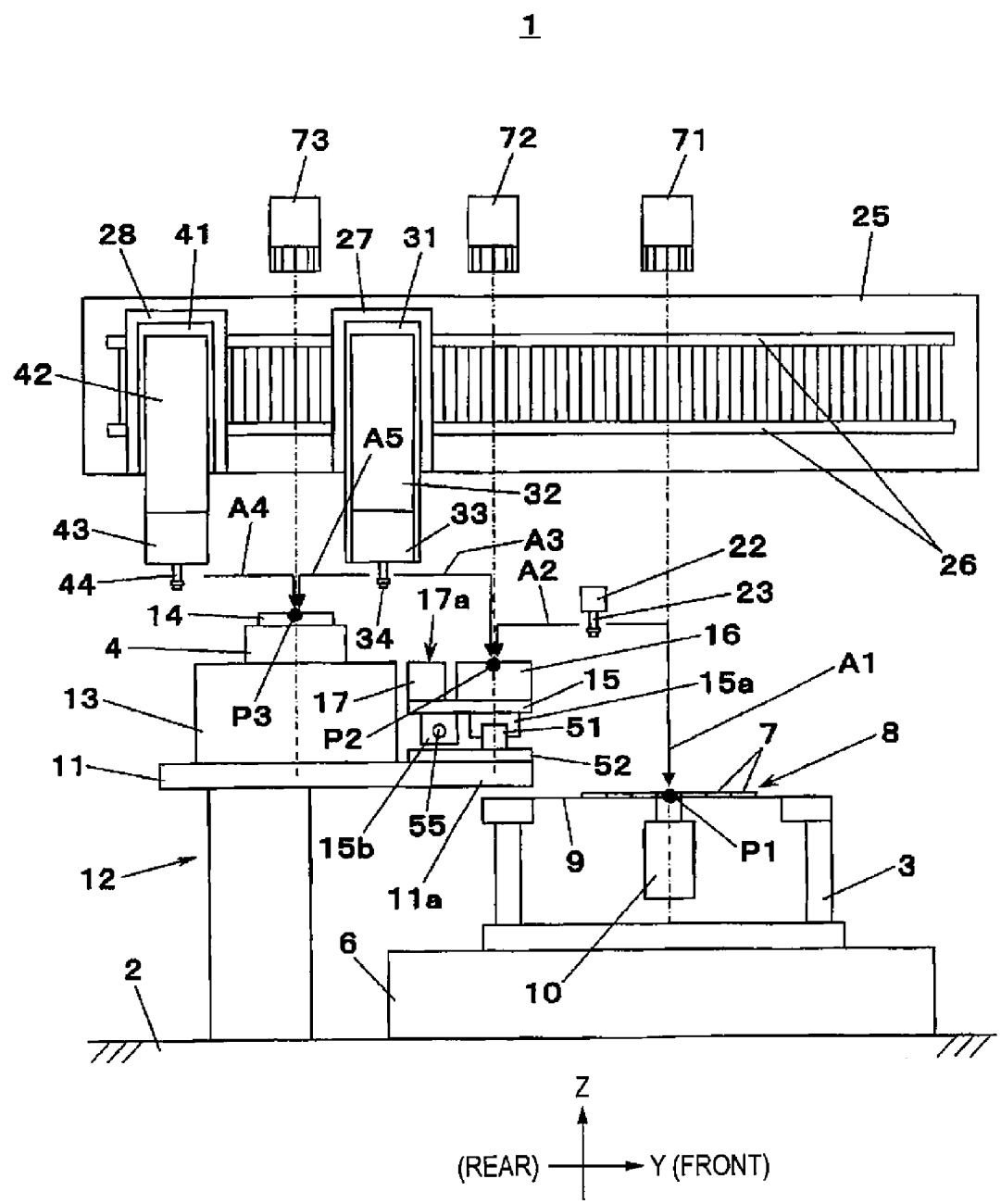
FIG. 2 is a front view of a main part of the components packaging system according to the embodiment of the invention.

In FIGS. 1 and 2, in a components packaging system 1, a components supply stage 3 and a substrate holding stage 4 are provided so as to be aligned in a front-rear direction (referred to as a Y-axis direction) of a base 2. At one of side portions of the base, a Y-axis frame 5, which extends in the Y-axis direction, is provided so as to be supported on two supporting pillars 5a which are erected on an upper surface of the base 2 so as to be aligned in the front-rear of Y-axis direction. Hereinafter, in this embodiment, in the front-rear direction of the base 2, a side where the components supply stage 3 is provided is referred to as front, while a side where the substrate holding stage 4 is provided is referred to as rear. In addition, a horizontal direction which is at right angles to the Y-axis direction is referred to as an X-axis direction. In the X-axis direction, a side where the Y-axis frame 5 is provided is referred to as right and an opposite side thereto is referred to as left.

In FIG. 2, a components supply stage moving mechanism 6 is provided at a front area of the base 2, and the components supply stage 3 is mounted on the components supply stage moving mechanism 6. The components supply stage moving mechanism 6 is made up of an XY table unit, and the components supply stage 3 can be moved inwards on a horizontal plane by driving the components supply stage moving mechanism 6. A semiconductor wafer 8, which is cut into a plurality of components (chips) 7, is supported on the components supply stage 3 in such a way as to be affixed to an upper surface of a sheet-like member 9. An ejector 10 is provided below the semiconductor wafer 8 which is adapted to push up a component 7 from therebelow.

In FIG. 2, a shelf member 12 is provided at a rear area of the base 2 so as to be erected therefrom, and the shelf member 12 includes a horizontal resting portion 11 which covers part (a rear portion) of the components supply stage 3 from thereabove. A substrate holding stage moving mechanism 13 is provided at a rear portion of the resting portion 11 of the shelf member 12, and the substrate holding stage 4 is mounted on the substrate holding stage moving mechanism 13. The substrate holding stage 4 is made up of an XY table unit, and the substrate holding stage 4 can be moved in a horizontal direction by driving the substrate holding stage moving mechanism 13. A substrate 14 is held on the substrate holding stage 4 which constitutes a target substrate on which a component 7 supplied from the components supply stage 3 is to be mounted.

In FIG. 2, a front area 11a of the resting portion 11 of the shelf member 12 is positioned between the components supply stage 3 and the substrate holding stage 4. A moving table 15 is provided at the front area 11a of the resting portion 11, and this moving table 15 is adapted to move freely in the X-axis direction. Provided on this moving table 15 are a intermediate stage 16 and a component recognition camera 17 whose image capturing plane 17a is oriented upwards.

In FIG. 1, a pick-up head moving mechanism 20 is provided on a lower surface of the Y-axis frame 5. The pick-up head moving mechanism 20 includes a pick-up head holding arm 21 which projects in the X-axis direction (leftwards) so as to extend horizontally. A pick-up head 22 is provided at a leading end (a left end) of the pick-up head holding arm 21. A pick-up tool 23 made up of a suction nozzle is detachably attached to the pick-up head 22.

The pick-up head moving mechanism 20 moves the pick-up head holding arm 21 in the X and Y directions (horizontal directions) and in a vertical direction (a Z-axis direction). A pick-up head suction mechanism 24 (FIG. 3) is provided in the pick-up head 22, and this pick-up head suction mechanism 24 operates to suck a component 7 via the pick-up tool 23.

In FIGS. 1 and 2, a head movement guide 25 is provided on a left side of the Y-axis frame 5. This head movement guide 25 constitutes a stator of a linear motor and extends in the Y-axis direction. Two rail portions 26 extending horizontally are formed on a left side of the head movement guide 25 so as to be spaced apart vertically. A front moving plate 27 and a rear moving plate 28, which constitute movers of linear motors, are provided on the two rail portions 26 so as to move individually freely in the horizontal direction (the Y-axis direction) along the rail portions 26 (along the head movement guide 25). A front end portion of the head movement guide 25 extends forwards (namely, to an opposite side to the substrate holding stage 4) to surpass a position above the components supply stage 3. A rear end portion of the head movement guide 25 extends further rearwards than the substrate holding stage 4.

The head movement guide 25 and the front moving plate 27 make up a linear motor in which the head movement guide 25 functions as a stator, while the front moving plate 27 functions as a mover. This linear motor constitutes a mounting head horizontally moving mechanism 30 (FIG. 3) for moving the front moving plate 27 in the horizontal directions (the Y-axis directions) along the head movement guide 25 by switching magnetic poles of the front moving plate 27.

A mounting head lifting plate 32 is attached to a left side of the front moving plate 27 via a mounting head lifting mechanism 31. A mounting head 33 is attached to a lower portion of the mounting head lifting plate 32. When the mounting head lifting mechanism 31 is driven, the mounting head lifting plate 32 moves upwards or downwards relative to the front moving plate 27, and the mounting head 33 attached to the mounting head lifting plate 32 ascends or descends.

A mounting tool 34 made up of a suction nozzle is detachably attached to the mounting head 33 so as to extend downwards. A mounting head suction mechanism 35 (FIG. 3) is provided within the mounting head 33, and this mounting head suction mechanism 35 performs a sucking operation via the mounting tool 34.

The head movement guide 25 and the rear moving plate 28 make up a linear motor in which the head movement guide 25 functions as a stator, while the rear moving plate 28 functions as a mover. This linear motor constitutes a stamping head horizontally moving mechanism 40 (FIG. 3) for moving the rear moving plate 28 in the horizontal directions (the Y-axis directions) along the head movement guide 25 by switching magnetic poles of the rear moving plate 28.

A stamping head lifting plate 42 is attached to a left side of the rear moving plate 28 via a stamping head lifting mechanism 41. A stamping head 43 is attached to a lower portion of the stamping head lifting plate 42. A stamp-like (a pin-like) stamping tool 44 is detachably attached to the stamping head 43. When the stamping head lifting mechanism 41 is driven, the stamping head lifting plate 42 moves upwards or downwards relative to the rear moving plate 28, and the stamping head 43 attached to the stamping head lifting plate 42 ascends or descends. In addition, a paste container 45 is installed below the rear end portion of the Y-axis frame 5, and the paste container 45 holds a paste (for example, a solder paste) which is to be stamped to a substrate 14 by the stamping head 43.

Figure 4:
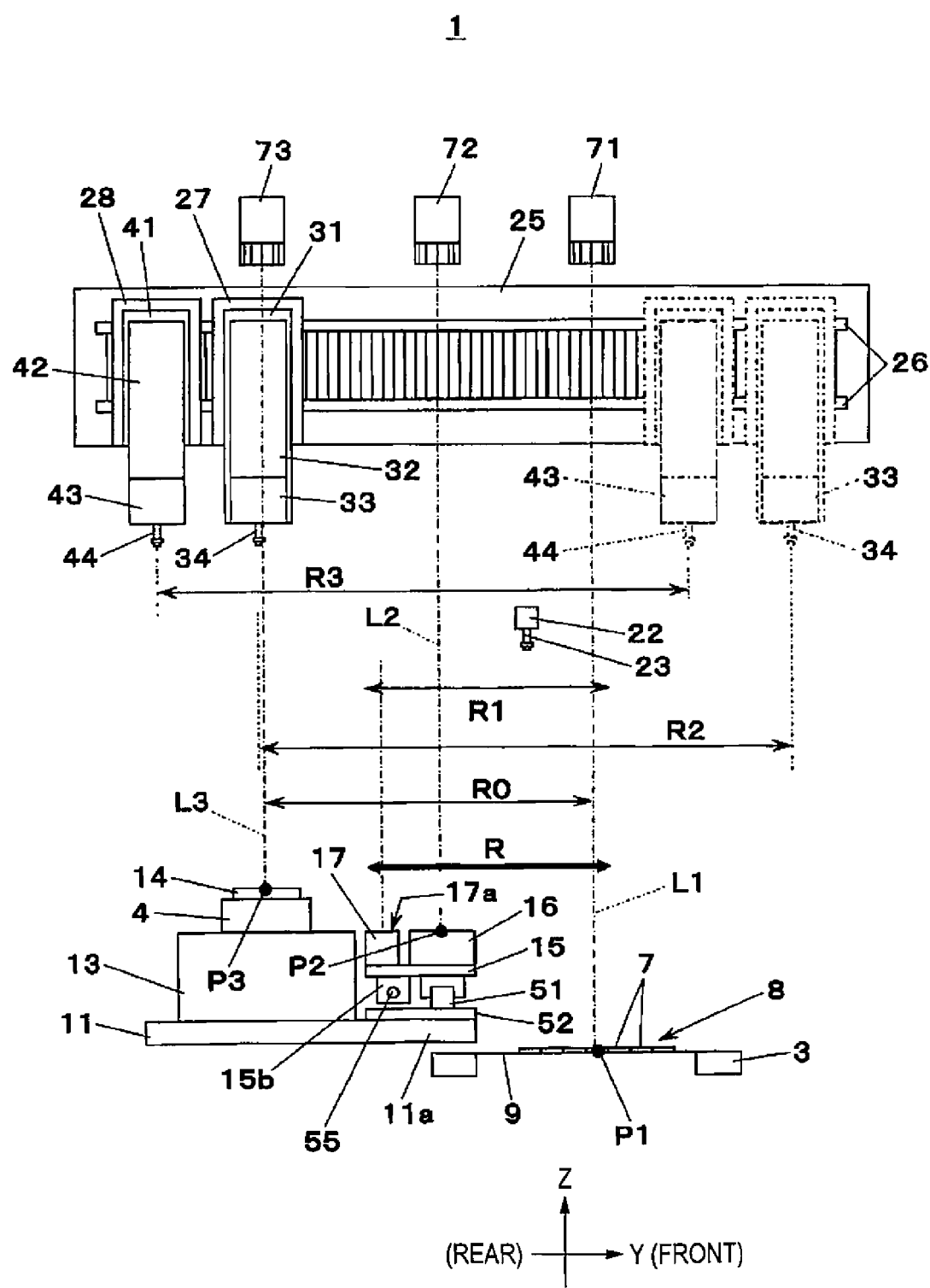
FIG. 4 is a front view of the main part of the components packaging system according to the embodiment of the invention.

In FIGS. 2 and 4, the pick-up head 22 can pick up a component 7 supplied to the components supply stage 3. The pick-up head 22 can move over an area R1 as its moving area which is defined in the Y-axis direction to carry the component 7 so picked up to a rear position on the intermediate stage 16. This moving area R1 of the pick-up head 22 includes a point where a component 7 supplied to the components supply stage 3 is picked up (hereinafter, referred to as a pick-up point P1) and a point where the component 7 so picked up is carried to be placed on the intermediate stage 16 (hereinafter, referred to as a intermediate point P2). These pick-up point P1 and intermediate point P2 are specified, respectively, on the components supply stage 3 and the intermediate stage 16 as fixed points on a coordinate system which is based on the base 2.

In FIG. 4, the mounting head 33 can move over an area R2 as its moving area which is defined in the Y-axis direction between a frontmost moving position where the mounting head 33 moves to a limit position at a front-end side of the head movement guide 25 (refer to the mounting head 33 indicated by alternate long and short dash lines) and a rearmost moving position where the mounting head 33 moves to a limit position at a rear-end side of the head movement guide 25 (refer to the mounting head 33 indicated by solid lines). This moving area R2 of the mounting head 33 includes a point where the component 7 picked up at the intermediate point P2 is packaged (hereinafter, referred to as a packaging point 3) in addition to the pick-up point P1 and the intermediate point P2. This packaging point 3 is also specified on the substrate holding stage 4 as a fixed point on the coordinate system which is based on the base 2.

In addition, in FIG. 4, the stamping head 43 can also move over an area R3 as its moving area which is defined in the Y-axis direction between a frontmost moving position where the stamping head 43 moves to a limit position at the front-end side of the head movement guide 25 (refer to the stamping head 43 indicated by alternate long and short dash lines) and a rearmost moving position where the stamping head 43 moves to a limit position at the rear-end side of the head movement guide 25 (refer to the stamping head 43 indicated by solid lines). This moving area R3 of the stamping head 43 includes, as with the moving area R2 of the mounting head 33 the packaging point 3 in addition to the pick-up point P1 and the intermediate point P2.

As has been described before, the front area 11a of the resting portion 11 of the shelf member 12 is positioned within an area R0 (FIG. 4) which is defined between the components supply stage 3 and the substrate holding state 4 (between the pick-up point P1 and the packaging point P3). In the front area 11a of the resting portion 11, a rail member 51 is provided so as to be supported on a frame member 52, and the rail member 51 extends in the horizontal direction (that is, the X-axis direction) which is at right angles to the horizontal direction (that is, the Y-axis direction) in which the components supply stage 3 and the substrate holding stage 4 are aligned. A slider portion 15a is formed on a lower surface of the moving table 15, and this slider portion 15a is brought into engagement with the rail member 51 so that the whole of the moving table 15 is allowed to move in the X-axis direction.

Figure 5:
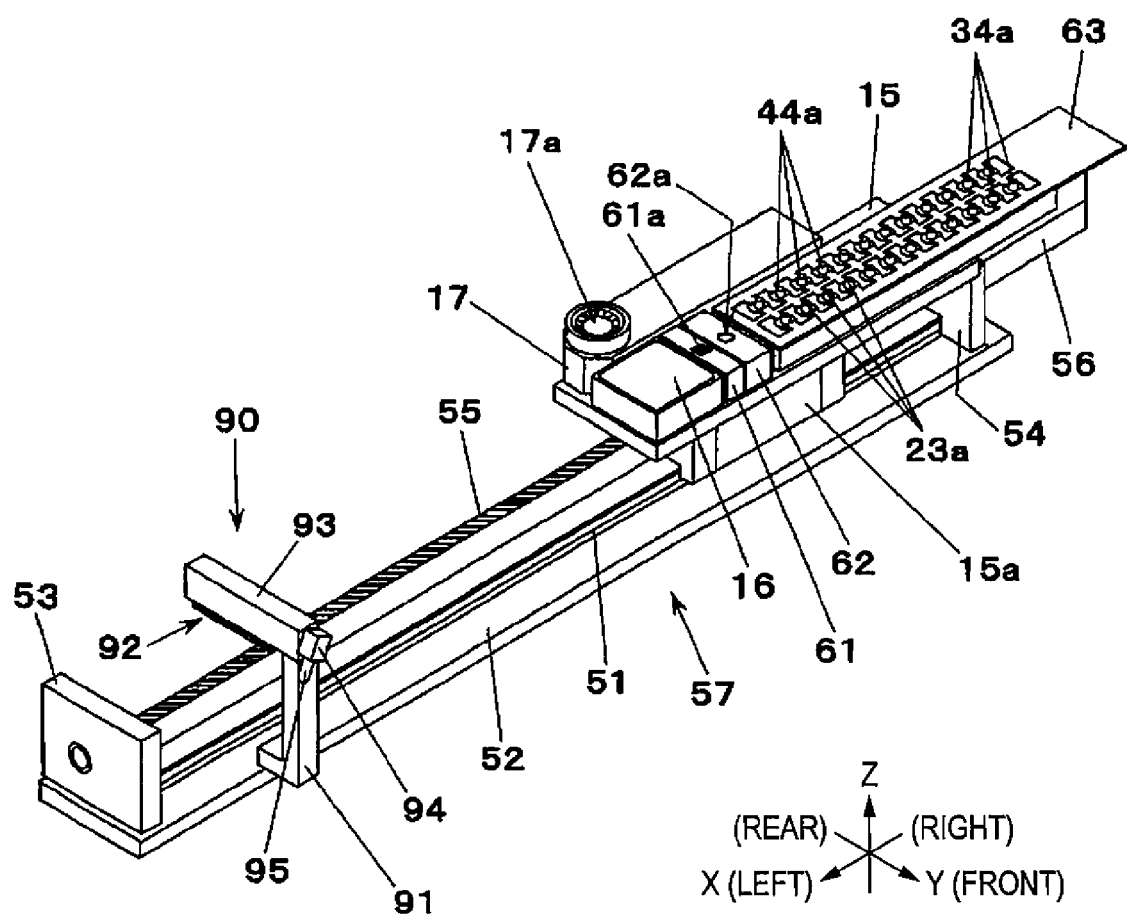
FIG. 5 is a perspective view of a moving table and a moving table moving mechanism which are included in the components packaging system according to the embodiment of the invention.
Figure 6:
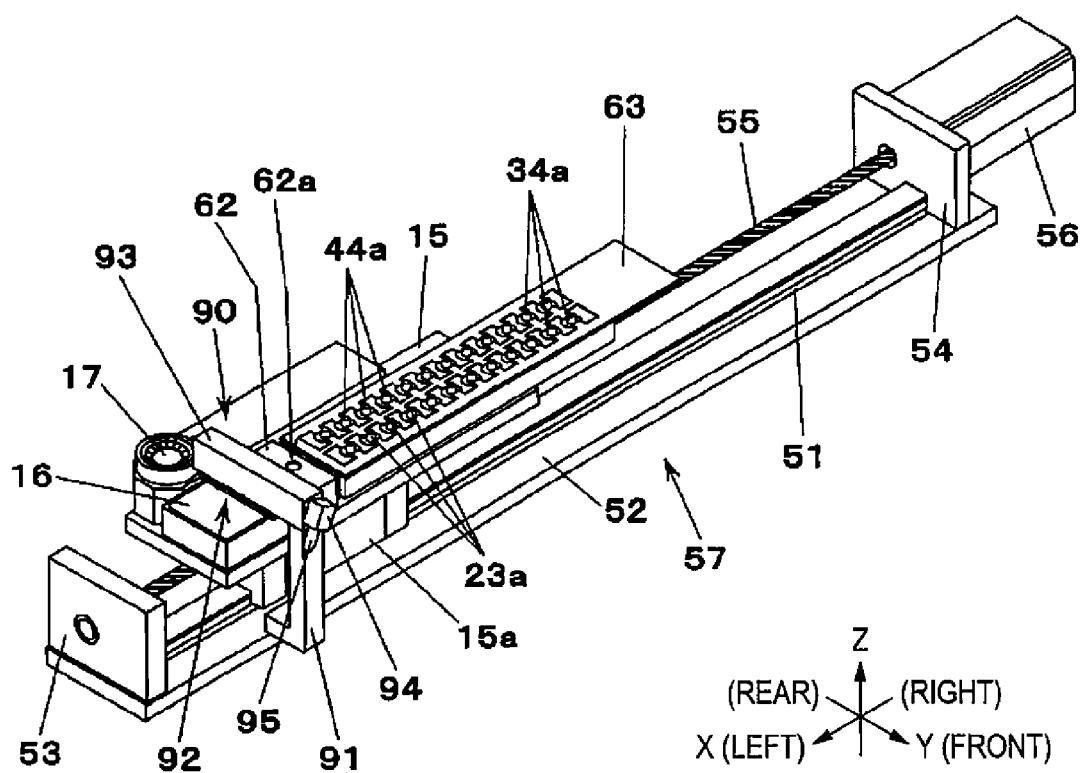
FIG. 6 is a perspective view of the moving table and the moving table moving mechanism which are included in the components packaging system according to the embodiment of the invention.

In FIGS. 5 and 6, screw supporting members 53, 54 are erected at left and right end portions of the frame member 52. End portions of a feed screw 55, which extends parallel to the rail member 51 (that is, in the X-axis direction), are rotatably supported in both the screw supporting members 53, 54. A nut portion 15b (FIG. 2) is provided on a lower surface of the moving table 15, and the nut portion 15b screws on the feed screw 55. When the feed screw 55 is rotated about the X-axis by a table moving motor 56 attached to the right-hand screw supporting member 54, the moving table 15 moves in the X-axis direction along the rail member 51. In this way, the slider portion 15a, the nut portion 15b, the rail member 51 and the table moving motor 56 make up a moving table moving mechanism 57 (FIG. 3) for moving the moving table 15, which is positioned between the components supply stage 3 and the substrate holding stage 4, in the X-axis direction.

In FIGS. 5 and 6, the intermediate stage 16, a reference stage 61, a component disposal portion 62 and a tools holding member 63 are provided on an upper surface of the moving table 15 sequentially in that order from the left thereof. In addition, the component recognition camera 17 is provided at a rear of the moving table 15 in a posture in which the image capturing plane 17a thereof is oriented upwards. The reference stage 61 includes a reference mark 61a on an upper surface thereof. A waste component disposal port 62a is opened in an upper surface of the component disposal portion 62. Held on the tools holding member 63 are replacement pick-up tools (denoted by reference numeral 23a) for the pick-up tool 23 provided on the pick-up head 22, replacement mounting tools (denoted by reference numeral 34a) for the mounting tool 34 provided on the mounting head 33 and replacement tools (denoted by reference numeral 44a) for the stamping head 44 provided n the stamping head 43. Here, the reference mark 61a is intended to correct (calibration) a position error of the moving table 15 which is attributed to thermal expansion or the like.

Figure 7:
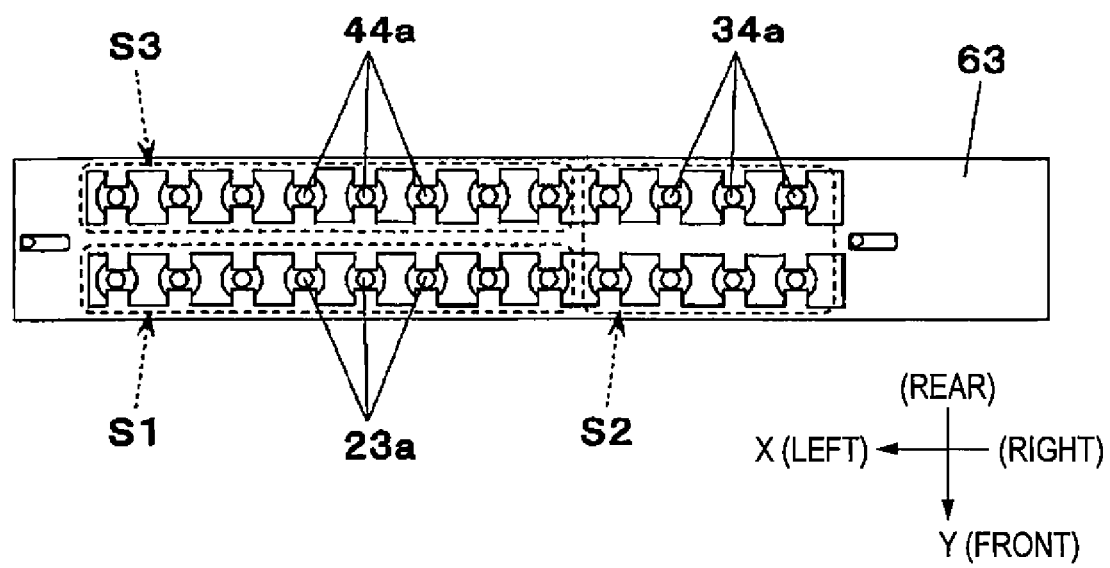
FIGS. 7 (a) and (b) are Plan views of a tools holding member included in the components packaging system according to the embodiment of the invention.
Figure 7:
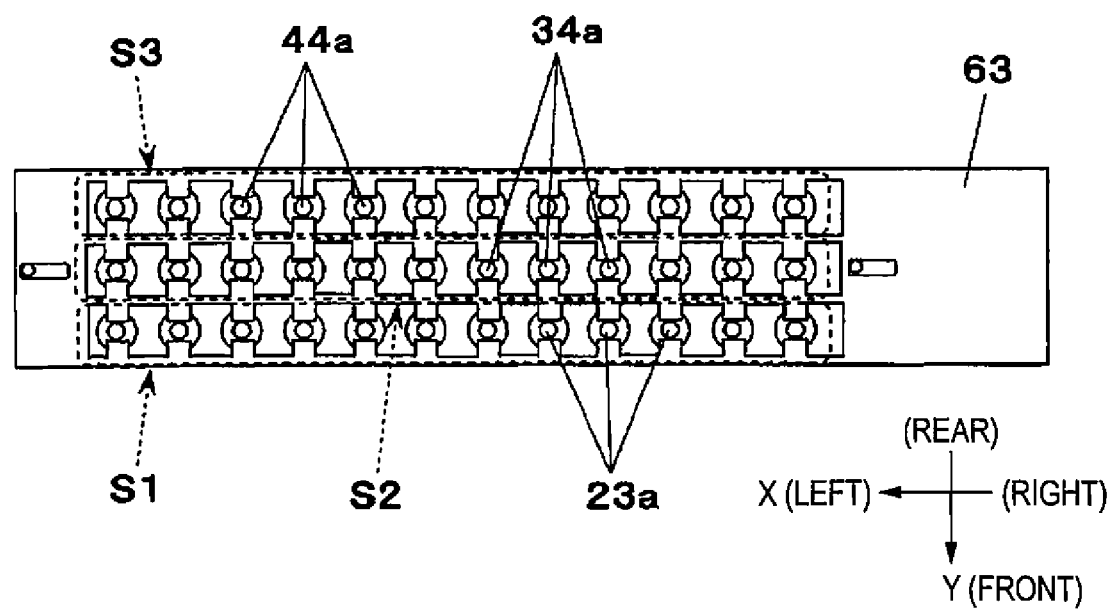

Replacement pick-up tools 23a for the pick-up head 22, replacement mounting tools 34a for the mounting head 33 and replacement stamping tools 44a for the stamping head 43 are disposed as individual groups of replacement tools 23a, 34a, 44a on the tools holding member 63. For example, as is shown in FIGS. 5 and 6, in the event of replacement tools accommodating portions being arranged into two rows, the two rows of replacement tools accommodating portions are divided into, for example, as is shown in FIG. 7(a), three areas (a first area S1, a second area S2, and a third area S3). Then, replacement pick-up tools 23a are accommodated in the first area S1, replacement mounting tools 34a are accommodated in the second area S2, and replacement stamping tools 44a are accommodated in the third area S3. As this occurs, the respective groups of replacement tools are preferably disposed on sides which are close to the heads to which the replacement tools are to be attached. Consequently, in the event that the pick-up head 22, the mounting head 33 and the stamping head 43 are disposed so as to be aligned sequentially in that order from the front of the tools holding member 63 as in this embodiment, as is shown in FIG. 7(a), the first area S1 where the replacement pick-up tools 23a are accommodated is disposed on the front row, and the third area S3 where the replacement stamping tools 44a are accommodated is disposed on the rear row.

In addition, as is shown in FIG. 7(b), in the event that the tools holding member 63 being configured so that replacement tools accommodating portions are divided in three rows which are aligned in the Y-axis direction, an order in which replacement tools 23a, 34a, 44a are arranged can be made the same as an order in which the corresponding heads (the pick-up head 22, the mounting head 33 and the stamping head 34) are arranged (the moving directions of the heads, that is, the order in which the heads are aligned in the Y-axis direction). In this embodiment, it is recommendable that the first area S1 where replacement pick-up tools 23a are accommodated, the second area S2 where replacement mounting tools 34a are arranged and the third area S3 where replacement stamping tools 44a are accommodated are aligned sequentially in that order from the front.

Figure 8:
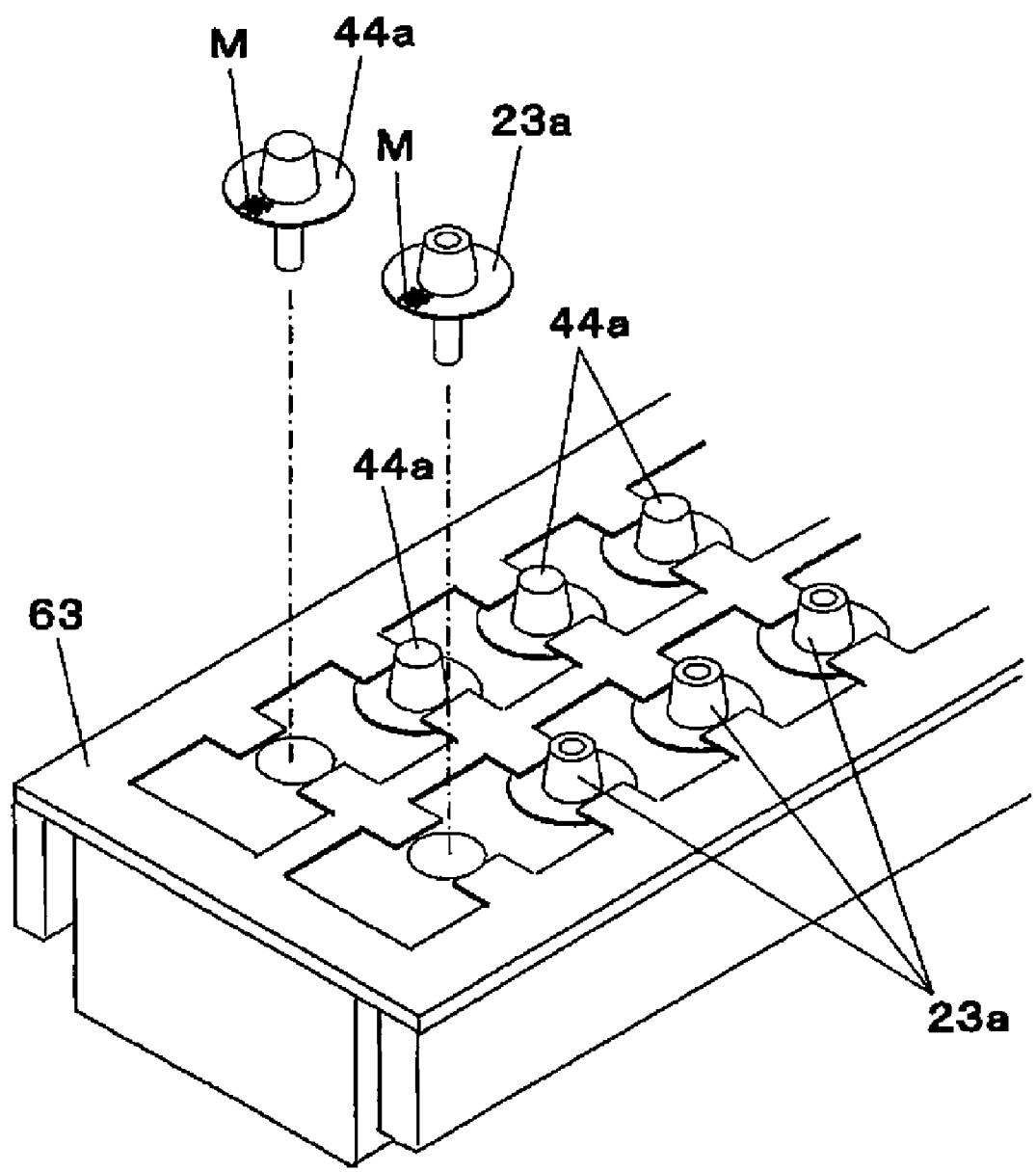
FIG. 8 is a perspective view showing part of the tools holding member included in the components packaging system according to the embodiment of the invention together with replacement tools.

In addition, marks M are affixed to the respective tools 23, 34, 44 (23a, 34a, 44a), and the marks M are visible from thereabove (in FIG. 8, only replacement tools 23a, 44a are shown). After respective replacement tools 23a, 34a, 44a are accommodated (set) on the tools accommodating member 63, the marks affixed to the respective replacement tools are image recognized by a camera whose field of view for capturing an image is oriented downwards, thereby making it possible to verify that the respective replacement tools are disposed in the proper areas on the tools holding member 63.

In FIGS. 1 and 2, a component supply stage camera 71, a intermediate stage camera 72 and a substrate holding stage camera 73 are provided sequentially in that order on a left-hand side and above the head movement guide 25 in a posture in which their image capturing planes are oriented downwards. As is shown in FIG. 4, an optical axis L1 of the component supply stage camera 71 passes through the pick-up point P1 set on the components supply stage 3, and an optical axis L2 of the intermediate stage camera 72 passes through the intermediate point P2 set on the intermediate stage 16. In addition, an optical axis L3 of the substrate holding stage camera 73 passes through the packaging point P3 set on the substrate holding stage 4.

Figure 3:
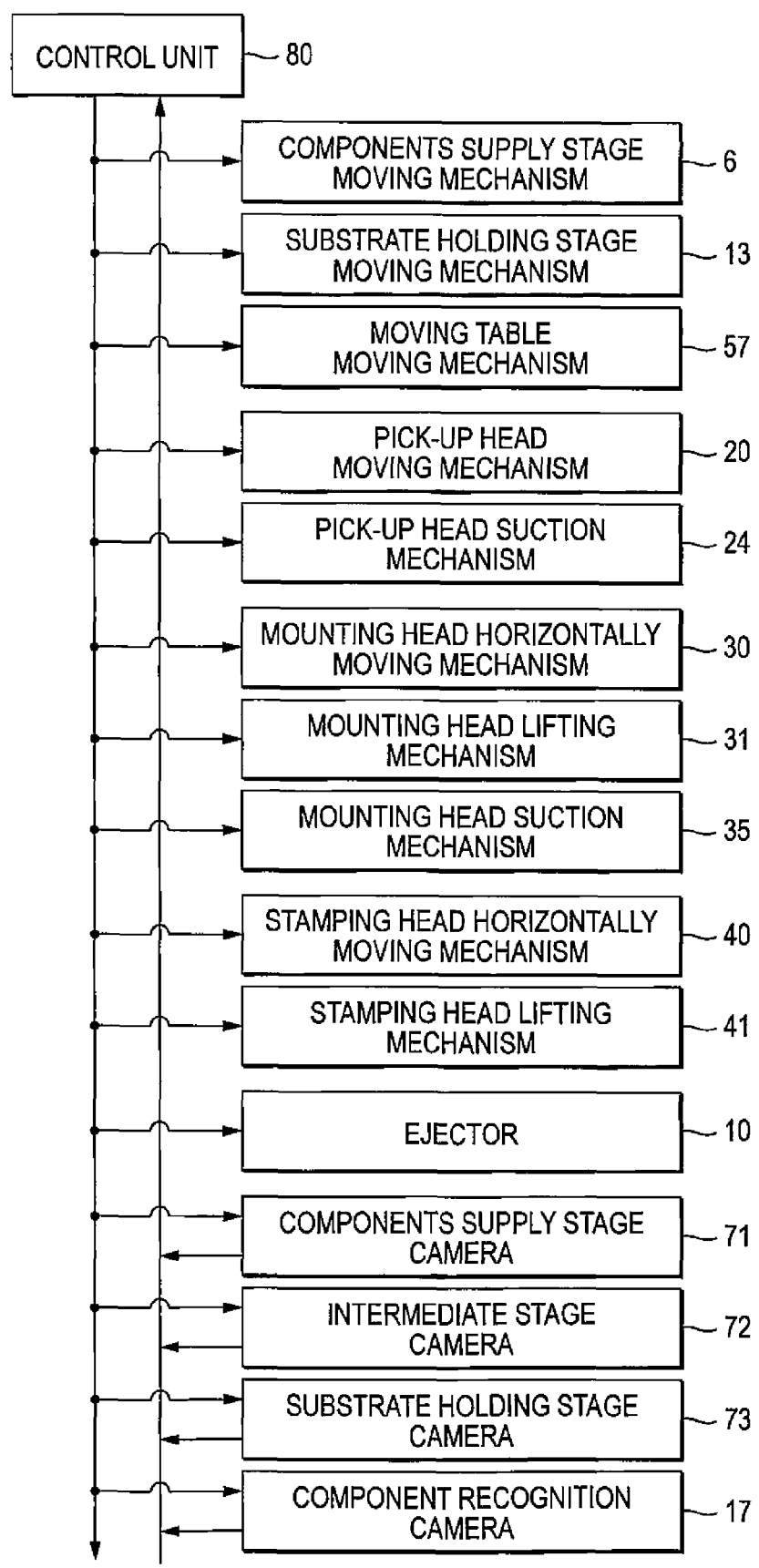
FIG. 3 is a block diagram showing a control system of the components packaging system according to the embodiment of the invention.

In FIG. 3, a control unit 80 provided in this components packaging system 1 controls the operation of the components supply stage moving mechanism 6 so as to move the components supply stage 3 in the horizontal direction relative to the base 2. The control unit 80 controls the operation of the moving table moving mechanism 57 so as to move the moving table 15 in the X-axis direction along the rail member 51 relative to the base 2.

In addition, the control unit 80 controls the pick-up head moving mechanism 20 so as to move the pick-up head 22 in the Y-axis direction and the Z-axis direction. The control unit 80 controls the operation of the pick-up head suction mechanism 24 so as to cause the pick-up head 22 to suck a component 7 via the pick-up tool 23.

Additionally, the control unit 80 controls the operation of the mounting head horizontally moving mechanism 30 so as to move the mounting head 33 attached to the front moving plate 27 in the horizontal direction (the Y-axis direction). The control unit 80 controls the operation of the mounting head lifting mechanism 31 so as to cause the mounting head 33 to ascend or descend. In addition, the control unit 80 controls the operation of the mounting head suction mechanism 35 so as to cause the mounting head 33 to suck the component 7 via the mounting tool 34.

In addition, the control unit 80 controls the operation of the stamping head horizontally moving mechanism 40 so as to move the stamping head 43 attached to the rear moving plate 28 in the horizontal direction (the Y-axis direction). The control unit 80 controls the operation of the stamping head lifting mechanism 41 so as to cause the stamping head 43 to ascend or descend to thereby cause the stamping tool 44 to suck a paste in the stamping paste container 45 for stamping the paste on to a substrate 14 held on the substrate holding stage 4.

The control unit 80 drives the ejector 10 so as to forcibly raise a component 7 which lies at the pick-up point P1 on the components supply stage 3.

In addition, the control unit 80 controls the operation of the components supply stage camera 71 so as to cause the same camera to capture an image of an area including the pick-up point P1. The control unit 80 controls the operation of the intermediate stage camera 72 so as to cause the same camera to capture an image of an area including the intermediate point P2. The control unit 80 controls the operation of the substrate holding stage camera 73 so as to cause the same camera to capture an image of an area including the packaging point P3. The control unit 80 controls the operation of the component recognition camera 17 so as to cause the same camera to capture an image of an area lying directly thereabove. Images captured by the components supply stage camera 71, the intermediate stage camera 72, the substrate holding stage camera 73 and the component recognition camera 17 are inputted into the control unit 80 (FIG. 3).

The control unit 80 performs a calibration on the moving table 15 so as to correct a position error thereof in the X-axis direction by recognizing the position of the moving table 15 by capturing an image of the reference mark 61a periodically or at a predetermined timing by the intermediate stage camera 72.

Next, in the components packaging system 1, a procedure will be described of mounting a component 7 on the components supply stage 3 on a substrate 14 held on the substrate holding stage 4.

In FIG. 2, firstly, the control unit 80 controls the operation of a wafer transfer mechanism, not shown, so as to cause the components supply stage 3 to hold a semiconductor wafer 8 which is cut into a plurality of components 7. Then, the control unit 80 controls the operation of a substrate transfer mechanism, not shown, so as to cause the substrate holding stage 4 to hold a substrate 14 which constitutes a target substrate in which a component 7 is to be packaged (a preparation step).

When the preparation step is completed, the control unit 80 moves the intermediate stage 16 in the X-axis direction so that a predetermined position on the intermediate stage 16 (for example, a center position of the intermediate stage 16) is positioned at the intermediate point P2 (an intermediate stage aligning step).

When the intermediate stage aligning step is completed, the control unit 80 moves the semiconductor wafer 8 on the components supply stage 3 within the horizontal plane so as to position a component 7 which constitutes a packaging target component at the pick-up point P1 while referring to (a component aligning step) while referring to the image captured by the components supply stage camera 71. Then, the control unit 80 moves the substrate 14 on the substrate holding stage 4 within the horizontal plane so as to position a target packaging portion on the substrate 14 at the packaging point P3 while referring to the image captured by the substrate holding stage camera 73 (a substrate aligning step).

When the component aligning step and the substrate aligning step are completed, the control unit 80 positions the pick-up head 22 at the pick-up point P1 and then causes the pick-up tool 23 to suck the component 7 (a pick-up head's pick-up step in which the pick-up head 22 moves as indicated by an arrow A in FIG. 2). In this pick-up head's pick-up step, in order to facilitate the sucking of the component 7 by the pick-up tool 23, the control unit 80 activates the ejector 10 so that the component 7 is forcibly raised from therebelow.

When the pick-up head's pick-up step is completed, the control unit 80 moves the pick-up head 22 from the pick-up point P1 to the intermediate point P2 so as to move the component 7 to the intermediate stage 16 (a component moving and placing step in which the pick-up head 22 moves as indicated by an arrow A2 in FIG. 2). Having moved and placed the component 7 on the intermediate stage 16, the pick-up head 22 is moved back to the pick-up point P1 to perform the next pick-up head's pick-up step.

When the component moving and placing step is completed, the control unit 80 refers to the image captured by the intermediate stage camera 72 to calculate a position error of the component 7 from the intermediate point P2 on the intermediate stage 16 (a position error calculation step). Here, when an error amount of the component 7 in the X-axis direction from the intermediate point 2 is obtained, the control unit 80 moves the moving table 15 in the X-axis direction, so that the error amount in the x-axis direction is corrected (an X-axis position correction step).

When the position error calculation step and the X-axis position correction step are completed, the control unit 80 moves the mounting head 33 to a position lying above the intermediate point P2 so as to cause the mounting tool 34 to suck the component 7 placed at the intermediate point 2 in the component moving and placing step to thereby pick up the component 7 (a mounting head's pick-up step in which the mounting head 33 moves as indicated by an arrow A3 in FIG. 2). As this occurs, the position of the mounting head 33 in the Y-axis direction above the intermediate point P2 is controlled so as to correct an error amount of the component in the Y-axis direction from the intermediate point P2 which is obtained in the position error calculation step.

Then, at almost the same time as the mounting head's pick-up step occurs, the control unit 80 moves the stamping head 43 from a waiting position (at a rear end portion area of the head movement guide 25, refer to the position of the stamping head 43 shown in FIG. 2) to a position above the packaging point P3, so that a paste is stamped on to the packaging point P3 (that is, the packaging target portion on the substrate 14) by the stamping head 43 (a paste stamping step in which the stamping head 43 moves as indicated by an arrow A4 in FIG. 2).

When the paste stamping step is completed, the control unit 80 withdraws the stamping head 43 from the packaging point P3 to the waiting position (a stamping head withdrawal step). Then, immediately the stamping head withdrawal step is completed, the control unit 80 moves the mounting head 33 from the intermediate point P2 to the position above the packaging point P3 so that the component 7 picked up in the mounting head's pick-up step is mounted at the packaging point P3 (a component mounting step in which the mounting head 33 moves as indicated by an arrow A5 in FIG. 2). By this series of operations, the component 7 supplied to the pick-up point P1 on the components supply stage 3 is packaged on the target packaging portion on the substrate 14 by way of the intermediate stage 16.

When the component 7 has been packaged on the target packaging portion on the substrate 14 in the way described above, the steps (the intermediate stage aligning step→ the component aligning step and the substrate aligning step→ . . . →the component mounting step) after the preparation step are continuously repeated.

In the component mounting step, when the component 7 picked up from the intermediate point P2 by the mounting head 33 passes over the component recognition camera 17, the control unit 80 stops the movement of the mounting head 33 temporarily so that the component 7 sucked to the mounting tool 34 stays still in an area directly above (that is, within the image capturing field of view of) the component recognition camera 17, whereby an image of the component 7 is captured (or the component 7 is recognized) so as to obtain information on the position of the component 7. By this operation, the control unit 80 can calculate an absorption error of the component 7 relative to the mounting tool 34. Then, when the component 7 is mounted on the substrate 14, the control unit 80 controls the moving distance of the mounting head 33 so that the absorption error is corrected, thereby making it possible to allow the component 7 to be packaged at the packaging target portion on the substrate 14 accurately.

Figure 9:
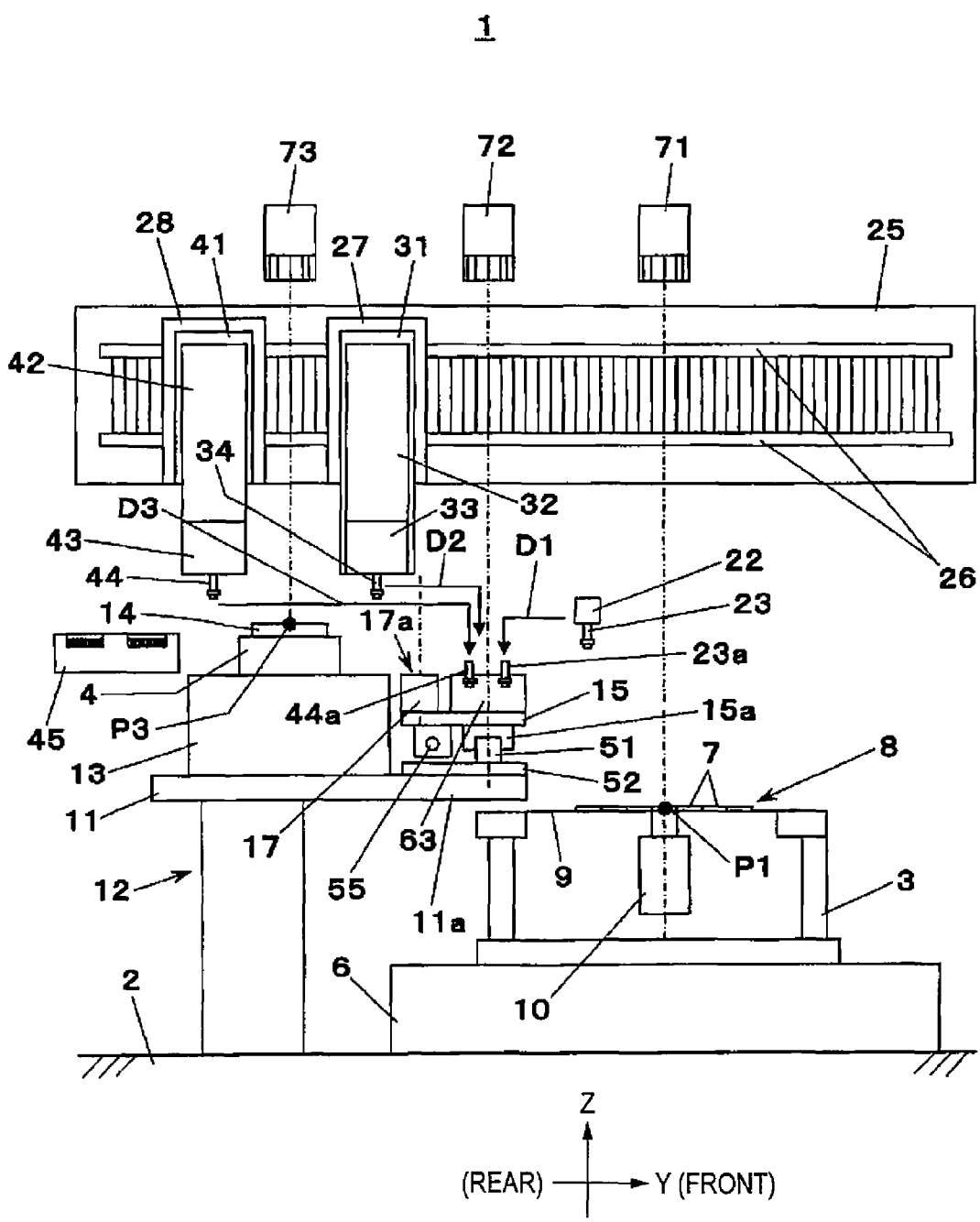
FIG. 9 is a front view of the main part of the components packaging system according to the embodiment of the invention.

Incidentally, in the components packaging system 1 configured as has been described heretofore, in the midst of packaging the component, the pick-up tool 23 attached to the pick-up tool 22, the mounting tool 34 attached to the mounting head 33 and the stamping tool 44 attached to the stamping head 43 need to be replaced by the corresponding replacement tools to match shapes of components 7 that are to be packaged on a substrate 14. These replacement tools (the replacement pick-up tools 23a, the replacement mounting tools 34a and the replacement stamping tools 44a) are held on the tools holding member 63 as described before (FIGS. 5, 6). However, since the tools holding member 63 is provided within the overlapping area R (FIG. 4) of the moving area R1 in which the pick-up head 22 can move in the Y-axis direction, the moving area R2 in which the mounting head 33 can move in the Y-axis direction and the moving area R3 in which the stamping head 43 can move in the Y-axis direction (on the moving table 15 provided within the overlapping area R) which lies within the area R0 (FIG. 4) which is defined in the Y-axis direction (between the pick-up point P1 and the packaging point P3) between the components supply stage 3 and the substrate holding stage 4, the tools holding member 63 can be accessed from the three heads such as the pick-up head 22, the mounting head 33 and the stamping head 43 to replace the tools (the pick-up tool 23, the mounting tool 34 and the stamping tool 44) (refer to a moving path D1 of the pick-up head 22, a moving path D2 of the mounting head 33 and a moving path D3 of the stamping head 43 which are shown in FIG. 9).

In addition, as is described above, the component disposal portion 62 (FIGS. 5 and 6) is provided on the moving table 15. As with the intermediate stage 16 and the tools holding member 63, the component disposal portion 62 is also provided within the overlapping area R of the moving area R1 of the pick-up head 22 and the moving area R2 of the mounting head 33. Therefore, both the pick-up head 22 and the mounting head 33 can access the component disposal portion 62 on the moving table 15, whereby components 7 which are judged as being inappropriate for mounting or packaging can be disposed of from the waste component disposal port 62a before they are mounted on a substrate 14.

In addition, in this components packaging system 1, when maintenance work is performed on the mounting head 33 and the stamping head 43, as is shown in FIG. 4, the mounting head 33 and the stamping head 43 are moved as forwards as possible in the Y-axis direction along the head movement guide 25. Here, as has been described before, since the front end portion of the head movement guide 25 extends forwards (to the opposite side to the substrate holding stage 4) to surpass the position lying above the components supply stage 3, the mounting head 33 and the stamping head 43 can be moved to the position lying above the components supply stage 3, whereby the operator can perform the maintenance work on the mounting head 33 and the stamping head 43 very easily.

In addition, since the placement and pick-up of a component 7 is performed repeatedly at the intermediate stage 16, the surface of the intermediate stage 16 gets dirty by silicone dust or the like, and hence, the surface of the intermediate state 16 needs to be cleaned periodically. A intermediate stage cleaner 90 is provided on a left side of the frame member 52 for use in cleaning the intermediate stage 16.

As is shown in FIGS. 5 and 6, this intermediate stage cleaner 90 has a vertical portion 91 which is provided so as to end upwards from the frame member 52 and a brush portion 93 which extends horizontally from an upper end portion of the vertical portion 91 so as to cross the frame member 52 (that is, in the Y-axis direction) and on a lower surface of which a number of downwardly extending brush fibers 92 are planted. The control unit 80 controls the operation of the table moving motor 56 so as to move the moving table 15 in the Y-axis direction along the rail member 51 repeatedly. Then, the surface of the intermediate stage 16 is swept by the brush fibers 92 to be cleaned (FIG. 6). A suction port, not shown, is provided in the lower surface (the surface where the brush fibers 92 are planted) of the brush portion 93. This suction port is linked with a vacuum suction mechanism, not shown, via an interior suction line, not shown, which extends through an interior of the brush portion 93 and an exterior suction line 95 which is connected to a connector 94 fixed to the vertical portion 91 and which extends outwards of the brush portion 93. The control unit 80 controls the operation of this vacuum suction mechanism so as to suck out air from the exterior suction line 95 and the interior suction line, thereby making it possible to suck out dirt and dust on the intermediate stage 16 which is removed by the brush fibers 92 to the outside of the frame member 52 or the system.

Thus, as has been described heretofore, in the components packaging system 1 according to the embodiment, the moving table 15 is provided in the area lying between the components supply stage 3 (the components supply portion) for supplying components 7 and the substrate holding stage 4 (the substrate holding portion) for holding a substrate 14, and the moving table 15 so provided can move freely in the horizontal direction (the second direction, that is, the X-axis direction) which is at right angles to the horizontal direction (the first direction, that is, the Y-axis direction) in which the components supply stage 3 and the substrate holding stage 4 are aligned. Then, the tools holding member 63 is provided in the overlapping area R on the moving table 15 where the moving area R1 over which the pick-up head 22 can move, the moving area R2 over which the mounting head 33 can move and the moving area R3 over which the stamping head 43 can move overlap. Therefore, the components packaging system 1 can be made compact in size as a whole even though the tools holding member 63 which can be accessed by the three heads such as the pick-up head 22, the mounting head 33 and the stamping head 43 is installed between the components supply stage 3 and the substrate holding stage 4.

In addition, the moving table 15 is designed to move freely in the direction (the X-axis direction) which is at right angles to the direction (the Y-axis direction) in which the components supply stage 3 and the substrate holding stage 4 are aligned. In this configuration, with the moving table 15 moved in the X-axis direction, any position on the moving table 15 can be accessed by the three heads such as the pick-up head 22, the mounting head 33 and the stamping head 43. Thus, with other equipment than the tools holding member 63 which is commonly used by the pick-up head 22, the mounting head 33 and the stamping head 43 mounted on the moving table 15 as well, the workability can be increased further.

Additionally, as has been described above, in the event that the tools holding member 63 is configured so that the replacement tools accommodating portions are arranged in three rows (or more than three rows) in the Y-axis direction, the order in which the pick-up head 22, the mounting head 33 and the stamping head 43 are aligned can be made the same as the order in which the replacement pick-up tools 23a, the replacement mounting tools 34a and the replacement stamping tools 44a are arranged on the tools holding member 63. By adopting this configuration, the time necessary to replace tools can be reduced, and the cycle time can be improved as much as the reduction in the tool replacement time.

While the embodiment of the invention has been described heretofore, the invention is not limited to what has been illustrated in the embodiment. For example, in the embodiment, while the components supply stage 3 which supports the semiconductor wafer 8 which is cut into the plurality of components 7 is described as the example of the components supply portion for supplying components, the components supply portion is not limited to such a stage-like portion, and hence, the components supply portion may take the form of a tape feeder or a tray feeder which differs from the stage-like components supply portion. In addition, in the embodiment described above, while the reference stage 61 and the component disposal portion 62 are described as the constituent elements that are provided on the moving table 15 in addition to the intermediate stage 16, the tools holding member 63 and the component recognition camera 17, what is to be provided on the moving table 15 is not limited to those described, and hence, any other equipment can be provided on the moving table 15 as long as it can improve the workability.

The invention provides the components packaging system which can be made compact in size as a whole even though the tools holding member that can be accessed by the three heads such as the pick-up head, the mounting head and the stamping head is installed between the components supply portion and the substrate holding portion.

What is claimed is:

1. A components packaging method in a components packaging system comprising a stamping head which is provided so as to move freely on a guide provided along a first direction which is horizontal and in which a components supply portion for supplying a component and a substrate holding portion for holding a substrate are aligned and which stamps a paste on to a substrate held at the substrate holding portion by use of a stamping tool, a pick-up head which is provided so as to move freely on the guide and which picks up a components supplied by the components supply portion by use of a pick-up tool, a mounting head which is provided so as to move freely on the guide and which receives the component picked up by the pick-up head by use of a mounting tool to mount the component so received on the substrate on to which the paste has been stamped by the stamping head, and a tools holding member which is provided on an overlapping area of moving areas over which the pick-up head, the mounting head and the stamping head can move, respectively, between the components supply portion and the substrate holding portion and which holds replacement tools for the pick-up tool, the mounting tool and the stamping tool on a moving table which can move freely in a second direction which is horizontal and which is at right angles to the first direction, the method for packaging the component in a predetermined position on the substrate comprising the steps of:

disposing the replacement pick-up tool, the replacement mounting tool and the replacement stamping tool on the tools holding member so that an order in the first direction in which the replacement pick-up tool, the replacement mounting tool and the replacement stamping tool are arranged is the same as an order in the first direction in which the pick-up head, the mounting head and the stamping head are aligned;

replacing the pick-up tool with the replacement pick-up tool;

picking up the component with the replacement pick-up tool;

replacing the mounting tool with the replacement mounting tool;

receiving the component picked up with the replacement mounting tool;

replacing the stamping tool with the replacement stamping tool; and stamping a paste on to a substrate held on the substrate holding portion with the replacement stamping tool.

2. The components packaging method according to claim 1, wherein replacing the pick-up tool with the replacement pick-up tool is performed in accordance with the type of the component supplied; replacing the mounting tool with the replacement mounting tool is performed in accordance with the type of the component supplied; and replacing the stamping tool with the replacement stamping tool is performed in accordance with the type of the component supplied.

* * * * *